March 13, 1962 C. VAN NAMEN, JR., ETAL 3,025,437

SEMICONDUCTOR HEAT SINK AND ELECTRICAL INSULATOR

Filed Feb. 5, 1960

INVENTORS.
ROY W. MALARIK
CHARLES VAN NAMEN, JR
BY
Richard P. Alberi
AGENT

United States Patent Office 3,025,437
Patented Mar. 13, 1962

3,025,437
SEMICONDUCTOR HEAT SINK AND ELECTRICAL INSULATOR

Charles Van Namen, Jr., and Roy W. Malarik, Grand Rapids, Mich., assignors to Lear, Incorporated Filed Feb. 5, 1960, Ser. No. 6,995
2 Claims. (Cl. 317—235)

This invention relates to a heat sink and more particularly to a heat sink for a semiconductor.

A transistor, especially a power transistor, generates a large amount of heat which has to be removed. The collector of a power transistor is frequently connected to the shell of the transistor. The shell of the transistor is frequently placed in physical contact with its associated mounting surface to provide thermal conduction between the transistor and the mounting surface. When the shell is electrically connected to the mounting surface with the mounting surface grounded, electrical short circuits frequently occur. The mounting surface, in order to be an effective heat sink, has to be large. Consequently, if the mounting plate is electrically grounded, any electrical connections to the mounting surface other than ground creates a short circuit.

A second method of removing heat from the transistor is to electrically insulate the transistor from the mounting plate with alternate sheets of conductive and non-conductive material. Because the electrical insulation sheets which have hitherto been discovered are poor heat conductors, sheets which are good heat conductors are positioned between the electrical insulation sheets. Because the electrical insulation sheets are used, the heat conduction to the mounting surface is substantially reduced over the heat conduction of a conductive plate to the mounting plate.

It is therefore an object of this invention to provide means for thermally conducting heat away from a semiconductor without creating a conducting path.

Another object of this invention is to provide an electrically insulated heat sink for semiconductors.

Still another object of this invention is to provide an electrical insulative heat conductive means for mounting a transistor.

A further object of this invention is to provide a transistor having its junction thermally connected to and electrically insulated from a heat sink.

Further objects and advantages of the present invention will become apparent when the following description is taken in combination with the drawings in which.

Figure 1:
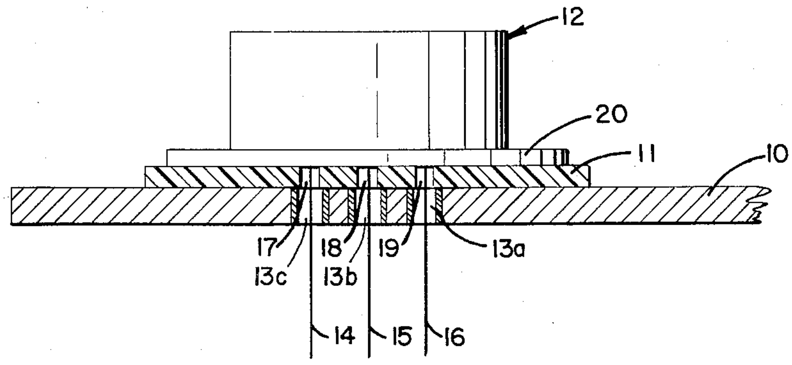
FIGURE 1 is a cross-sectional view one embodiment of the present invention.

Referring to FIGURE 1, the wafer 11 is positioned between and in physical contact with the transistor 12 and the mounting plate 10. The mounting plate 10 has insulated openings 13*a*, 13*b*, and 13*c* such that the electrical leads 14, 15 and 16 from the transistor 12 pass through without electrically contacting the mounting plate 10. The base or flange portion 20 of the transistor 12 is usually the warmest spot of the transistor so that it is desirable to remove heat from the flange portion of the transistor to a larger heat sink. The electrically insulative wafer 11 of this invention is constructed of heat conductive beryllium oxide. The properties of being an electrical insulator and a good heat conductor are unique in the beryllium oxide so that it is ideally suited for the purposes of this invention. Since the wafer 11 is in physical contact with the transistor 12 and the mounting plate 10, the heat generated by the transistor readily passes through the heat conducting wafer 11 to the mounting plate 10, while the transistor is electrically insulated from the mounting plate 10.

Figure 2:
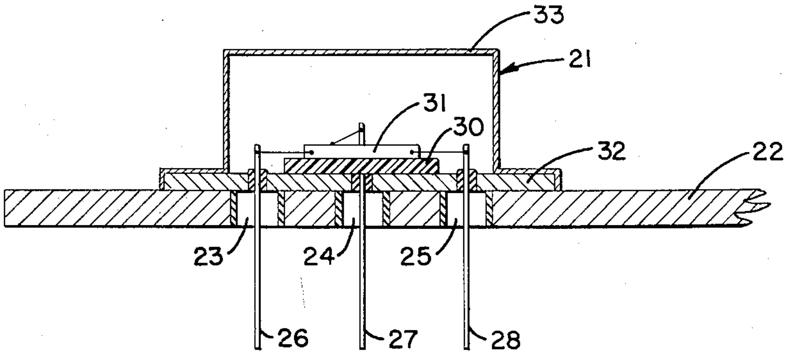
FIGURE 2 is a cross-sectional view of a second embodiment of the present invention.

Referring now to FIGURE 2, a typical electrical transistor 21 is mounted on a mounting plate 22 which has electrically insulated openings 23, 24 and 25 to accommodate the electrical leads 26, 27 and 28. A beryllium oxide wafer 30 is positioned in physical heat-conductive contact between the junction element 31 of transistor 21 and the metallic case header 32 to provide heat conduction and electrical insulation. The case header 32 is heat-conductively fastened to the metallic case 33.

In operation, the current flow through the junction 31 causes the junction 31 to become heated. The heat is conducted away by the beryllium oxide wafer of this invention so that the transistor functions properly. The heat conducts through the wafer 30 to the metallic case header 32. Although the majority of the heat is conducted to the mounting plate 22, some of the heat may be conducted to the metallic shell 33 of the transistor 21 where it is radiated and convected away.

This invention provides a means for removing heat from transistors and means to improve the heat conduction within the transistor while still providing electrical insulation either between the transistor junction and the transistor shell or between the transistor shell and the mounting plate or any combination thereof.

Although the present invention has been described with a certain degree of particularity, it is understood that various modifications in the details and arrangements of parts may be had without departing from the spirit and scope of the invention as hereinafter claimed:

We claim:

1. In combination, a transistor having a series of electrical leads extending from one end thereof; a mounting plate forming a series of electrically insulated holes, said series of electrical leads extending through said holes; a beryllium oxide wafer positioned between said transistor and said mounting plate, said wafer forming a series of holes therein which align with said series of holes in said mounting plate, said electrical leads passing through said wafer, said wafer thermally connecting said transistor with said mounting plate while physically separating said transistor from said mounting plate.

2. In combination, a transistor having a base portion and a series of electrical leads extending from the inside of said transistor, said base portion being beryllium oxide and having holes therein to allow said electrical leads to pass through said base portion, a mounting plate having a series of holes therein to accommodate said series of electrical leads, said base portion thermally connecting said transistor to said mounting plate while electrically insulating said transistor from said mounting plate.

References Cited in the file of this patent

UNITED STATES PATENTS

| | | |
|---|---|---|
| 2,759,133 | Mueller | Aug. 14, 1956 |
| 2,817,048 | Thuermel et al. | Dec. 17, 1957 |
| 2,825,014 | Willemse | Feb. 25, 1958 |
| 2,887,628 | Zierdt | May 19, 1959 |